US006864619B2

(12) United States Patent
Aigner et al.

(10) Patent No.: US 6,864,619 B2
(45) Date of Patent: Mar. 8, 2005

(54) PIEZOELECTRIC RESONATOR DEVICE HAVING DETUNING LAYER SEQUENCE

(75) Inventors: Robert Aigner, Unterhaching (DE); Elbrecht Lueder, Munich (DE); Stephan Marksteiner, Putzbrunn (DE); Winfried Nessler, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/716,327

(22) Filed: Nov. 18, 2003

(65) Prior Publication Data

US 2004/0130847 A1 Jul. 8, 2004

Related U.S. Application Data

(63) Continuation of application No. PCT/EP02/04717, filed on Apr. 29, 2002.

(30) Foreign Application Priority Data

May 18, 2001 (DE) .......................................... 101 24 349

(51) Int. Cl.[7] .............................................. H01L 41/08
(52) U.S. Cl. ...................... 310/321; 310/327; 310/366; 310/312
(58) Field of Search .................................. 310/312, 320, 310/321, 326, 363–366, 327

(56) References Cited

U.S. PATENT DOCUMENTS

| 4,771,205 A | * | 9/1988 | Mequio ........................ 310/334 |
| 5,646,583 A | * | 7/1997 | Seabury et al. .............. 333/187 |
| 5,894,647 A | * | 4/1999 | Lakin .......................... 29/25.35 |
| 6,441,703 B1 | * | 8/2002 | Panasik ....................... 333/189 |
| 6,466,105 B1 | * | 10/2002 | Lobl et al. ................... 333/187 |
| 6,469,597 B2 | * | 10/2002 | Ruby et al. .................. 333/187 |
| 6,515,558 B1 | * | 2/2003 | Ylilammi ..................... 333/189 |
| 6,566,979 B2 | * | 5/2003 | Larson et al. ................ 333/187 |
| 6,601,276 B2 | * | 8/2003 | Barber ......................... 29/25.35 |

FOREIGN PATENT DOCUMENTS

| JP | 60206315 A | 10/1985 | ............ H03H/9/17 |
| WO | WO99/10938 | 3/1999 | ............ H01L/41/08 |
| WO | WO99/59244 | 11/1999 | ............ H03H/9/00 |

* cited by examiner

Primary Examiner—Thomas M. Dougherty
(74) Attorney, Agent, or Firm—Baker Botts L.L.P.

(57) ABSTRACT

A resonator device includes a piezoelectric resonator having a detuning layer sequence arranged on the piezoelectric resonator. The detuning layer sequence includes at least a first layer having a high acoustic impedance and a second layer having a low acoustic impedance.

23 Claims, 8 Drawing Sheets

PIEZOELECTRIC RESONATOR DEVICE HAVING DETUNING LAYER SEQUENCE

CROSS REFERENCE TO RELATED APPLICATION

This application is a continuation of copending International Application No. PCT/EP02/04717 filed Apr. 29, 2002, and claiming a priority date of May 18, 2001, which designates the United States.

TECHNICAL FIELD OF THE INVENTION

The present invention relates to piezoelectric resonator devices and, in particular, to a piezoelectric thin-layer resonator device having a detuning layer sequence comprising several layers having different acoustic impedances.

DESCRIPTION OF THE RELATED ART

Piezoelectric resonators or bulk acoustic wave resonators (BAW resonators), respectively, are widely applied as filters in high frequency technology. In the widely used circuits of the ladder type or of the lattice or balanced type, several piezoelectric resonators are connected in series between an input and an output. In circuits of the ladder type, nodes between neighboring resonators are connected to ground via another BAW resonator (shunt resonator). In addition, further shunt resonators can be provided in parallel to the input and/or output of the filter. The one or the several shunt resonators have a resonance frequency which is typically lower by 2% to 3% than the resonance frequencies of the resonators connected in series between input and output. This slight detuning of the resonator groups relative to one another corresponds to about 50% to 80% of the filter bandwidth.

Typically all the resonators contained in the conductor circuit described are manufactured on a common substrate and connected to one another by conductive traces. A practically identical set-up of all the resonators on a substrate, without further measures being taken, results in practically identical resonance frequencies of the resonators.

An example of the set-up of a well-known BAW resonator will be discussed subsequently referring to FIG. 1A. The BAW resonator 10 includes a piezoelectric layer 20, such as, for example, made of AlN, ZnO, PZT. The piezoelectric layer 20, at a first surface 21, comprises a first electrode 22 and, at a second surface 23 opposite to the first surface 21, a second electrode 24, wherein the electrodes 22, 24 for example comprise aluminum, wolfram, molybdenum or a combination of these materials. The resonance frequency of the resonator 10 is fixed by the physical properties, such as, for example, thickness, sound velocity, acoustic impedance, of the materials used.

The piezoelectric resonator 10 is arranged on a substrate (not shown), wherein an acoustic isolation of the piezoelectric resonator 10 from the substrate is required. This acoustic isolation can, for example, be obtained by an acoustic reflector (not shown) arranged between the resonator and the substrate. The reflector has a plurality of layers made of materials having different mechanical properties. The thickness of each layer corresponds to about one quarter of the wavelength of a wave propagating in the layers or to an odd-numbered multiple of it. The acoustic isolation of the resonator from the substrate can also be obtained by means of other well-known techniques, such as, for example, by a cavity between the substrate and the resonator. Alternatively, the resonator can also be held by other constructions so that no substrate is provided in these cases.

FIG. 1B shows an arrangement having a first piezoelectric resonator 10 and a second piezoelectric resonator 10'. The second piezoelectric resonator is formed by two electrodes 22' and 24' formed on the first surface 21 and the second surface 23, respectively, of the piezoelectric layer 20. The resonators are connected to form a filter, wherein the first resonator 10 forms the shunt resonator described above.

In order to shift or detune the resonator frequency of the first resonator 10 relative to the resonance frequency of the second resonator 10', different measures limited in space to the resonator 10 can be taken. The change of the thickness of the first electrode 22 of the piezoelectric resonator 10, as is shown in FIG. 1B, results in a change of the resonance frequency of the resonator. In order to detune the resonator 10, the thickness of the first electrode 22, for example in an additional step, is changed by applying a thin additional metal layer or by thinning the first electrode 22 such as, for example, by etching a partial layer of the electrode.

Typical applications, such as, for example, in mobile radio communication, require a frequency precision of the resonators used in a filter in a range considerably below 1%, such as, for example, 0.25% in GSM 1800. These requirements are, however, difficult to fulfill in manufacturing the resonators described above so that further steps for fine-adjusting the resonance frequency must be taken.

After detuning has taken place, the first electrode 22, 22' is, for example, taken for fine-adjusting the frequency of the resonators 10, 10'. The fine-adjustment is performed by changing the thickness of the electrode or by depositing an additional layer having a fixed thickness on the electrodes. This takes place in both the detuned resonator 10 and the non-detuned resonator 10'. The change of the thickness of the first electrodes 22, 22', however, has the disadvantage of an undesired change of the detuning of the first resonator 10.

Since detuning strongly influences the performance of a filter formed by the resonators 10 and 10', trimming must not result in a strong change of the detuning so that the extent of "trimming" (frequency fine-adjustment) which can be applied to the resonators 10, 10' is strongly limited.

A well-known way of detuning a resonator is to associate a detuning layer made of a material having a high acoustic impedance or a low acoustic impedance to the resonator 10 to be detuned. This procedure and its results will be discussed referring to FIGS. 2A to 2C.

FIG. 2A shows a resonator device in which the detuned resonator 10 has a detuning layer 26. In the resonator device shown in FIG. 2A, the electrodes 22, 22', 24, 24' of the resonators 10, 10' are formed in several layers. The first electrode 22 of the first resonator 10 includes a first layer 28, such as, for example, made of wolfram, and a second layer 30, such as, for example, made of aluminum. The detuning layer 26 is arranged between the layers 28 and 30 of the first electrode 22. The first electrode 22' of the second resonator 10' includes a first layer 28', such as, for example, made of wolfram, and a second layer 30', such as, for example, made of aluminum. The second electrode 24 of the first resonator 10 includes a first layer 32, such as, for example, made of wolfram, and a second layer 24, such as, for example, made of aluminum. The second electrode 24' of the second resonator 10' includes a first layer 32', such as, for example, made of wolfram, and a second layer 34', such as, for example, made of aluminum. The layer thicknesses of the electrodes are essentially equal. Except for the detuning layer 26, the resonators 10 and 10' are essentially identical.

If a detuning layer 26 having a low acoustic impedance is used, the detuning layer is, for example, made of aluminum which has a low acoustic impedance. Alternatively, a layer of silicon oxide can be used. In this case, a corresponding contacting of the two layers of the electrode 22, such as, for example, via through holes, is required. For fine-adjusting the resonance frequency (in the case of a constant detuning layer), the thickness of the aluminum layer 30, 30' of the first electrodes 22, 22' of each resonator is changed. A change in the thickness of the aluminum layer 30 of the first electrode 22 additionally influences detuning the detuned resonator 10 relative to the non-detuned resonator 10'.

FIG. 2B shows a schematic illustration of the dependence of the detuning of the piezoelectric resonator 10 shown in FIG. 10A on the thickness $d_{Al}$ of the aluminum layer 30 of the first electrode 22 of the piezoelectric resonator 10. In FIG. 2B, the detuning versus the thickness $d_{Al}$ of the aluminum layer of the first electrode is shown and curve 36 shows the magnitude of detuning as a function of the thickness $d_{Al}$ with a constant thickness of the detuning layer 26. The detuning of the piezoelectric resonator 10 having the detuning layer relative to the piezoelectric resonator 10' not having a detuning layer, with otherwise identical properties, is, for example, 35 MHz with a thickness of the aluminum layer of the first electrode 22 of 0.66 μm, as is indicated in FIG. 2B by the point A. An enlargement of the thickness $d_{Al}$ results in an increase in detuning and a reduction of the thickness $d_{Al}$ results in a reduction of detuning. A tolerance range still acceptable is illustrated by lines 38 and 40, within which a variation from the must detuning obtained by an additional frequency correction (trimming) is allowed to be. Within this tolerance range, the effects of the variation of detuning from the 35 MHz, due to the frequency correction, on the properties of a filter including the resonator detuned in this way, are still negligible or at least acceptable.

A thickness region 42 is set by the intersections B and C of the curve 36 with the lines 38 and 40, respectively, within which the thickness $d_{Al}$ of the aluminum layer of the first electrodes 22, 22' can be changed. Due to the large gradient of the curve 36, only a small region of thicknesses of about 0.55 μm to about 0.7 μm is available. The thickness of the aluminum layer of the first electrodes 22, 22' can be changed in this area without causing a change of the detuning outside the tolerance range. If the tolerance region shown in FIG. 2B is fully exploited, that is if progress is made along the curve 36 from point B via point A to point C, a frequency correction (frequency shift) of ±10 MHz is obtainable with a resonance frequency of 900 MHz of the resonator by changing the thickness $d_{Al}$. Put differently, a resonance frequency of the resonator 20 of ±MHz results in a change in detuning still within the tolerance range.

Since in typical applications, such as, for example, in mobile radio communication, corrections of about ±3% of the resonance frequency are required, such as, for example, about ±30 MHz with a resonance frequency of 900 MHz, only a small portion of the filter arrangements manufactured can be corrected by the above method, that is that portion varying, as far as frequency is concerned, by ±10 MHz from the frequency desired. All the other filters having a larger variation cannot be corrected.

FIG. 2C shows the performance of an arrangement in which the detuned resonator 10, for detuning, includes a detuning layer 26 made of molybdenum having a high acoustic impedance. Alternatively, different materials having a high acoustic impedance can be used, such as, for example, wolfram, platinum or tantalum oxide ($Ta_2O_5$).

In FIG. 2C, the detuning versus the thickness $d_{Al}$ of the aluminum layer 30 of the first electrode 22 is shown and curve 44 shows the magnitude of detuning as a function of the thickness $d_{Al}$ with a constant thickness of the detuning layer. With a thickness of the aluminum layer of about 0.66 μm, as is illustrated in FIG. 2C by point A, the detuning of the piezoelectric resonator device 10 relative to the piezoelectric resonator device 10' not having a detuning layer which has otherwise identical properties, is about 35 MHz. Unlike the example discussed referring to FIG. 2B, an enlargement of the thickness $d_{Al}$ of the electrode has an inverse effect in a detuning layer having a high acoustic impedance, that is the detuning decreases. Inversely, the detuning of the piezoelectric resonator device increases when the thickness $d_{Al}$ of the electrodes decreases.

Similarly to FIG. 2B, a tolerance range still acceptable is illustrated in FIG. 2C by lines 46 and 48, within which a variation from the must detuning caused by an additional frequency correction (trimming) of the resonance frequency of the resonator is allowed to be. Variations of detuning within this tolerance range and the change of the filter properties connected thereto are still negligible or at least acceptable. A thickness region 50 is set by the intersections B and C of the curve 44 with the lines 46 and 48, respectively, within which the thickness $d_{Al}$ of the aluminum layer of the first electrodes may be changed. Due to the large gradient of the curve 44, only a small region of thicknesses of about 0.62 μm to about 0.78 μm is available. The thickness of the aluminum layer of the first electrode can be changed in this area without the frequency correction affected by this resulting in a change of detuning outside the tolerance range.

The trimming range is, however, in this case, too, limited for the same reasons as in the example of FIG. 2B; in the example shown in FIG. 2C this is 20 MHz with a resonance frequency of 900 MHz.

WO 99/10938 A relates to a piezoelectric resonator including a sacrificial layer for adjusting a frequency of it. The piezoelectric resonator has a piezoelectric layer on the two main surfaces of which electrodes are arranged. On one of the electrodes, the sacrificial layer is arranged, such as, for example, an oxide layer, wherein a diffusion barrier is preferably arranged between the sacrificial layer and the electrode. The sacrificial layer is thinned to increase a resonance frequency of the entire element to a desired value in order to adjust die target resonance frequency of the entire element.

U.S. Pat. No. 5,894,647 describes a method of forming piezoelectric resonators on a substrate such that a resonance frequency of a resonator, compared to the resonance frequencies of the remaining resonators, is shifted by a small amount. This is achieved by providing the concerned resonator the resonance frequency of which is to be shifted with a thin additional layer, for example by sputtering or the like in order to shift the frequency of the associated resonator element.

SUMMARY OF THE INVENTION

It is the object of the present invention to provide a piezoelectric resonator device and a filter, the resonance frequency of which can be trimmed over a great frequency range without detuning leaving a tolerance range.

In accordance with a first aspect of the invention, this object is achieved by a resonator device comprising a first piezoelectric resonator and a second piezoelectric resonator, wherein the first piezoelectric resonator and the second piezoelectric resonator each have a piezoelectric layer having a first surface and a second surface, a first electrode on the first surface and a second electrode on the second surface; and a detuning layer sequence arranged on the first piezoelectric resonator, wherein the detuning layer sequence is arranged on the first electrode of the first piezoelectric resonator or on the second electrode of the first piezoelectric resonator; and the detuning layer sequence comprises at least a first layer having a first acoustic impedance and a second layer having a second acoustic impedance in order to shift a resonance frequency of the first piezoelectric resonator relative to the resonance frequency of the second piezoelectric resonator, wherein the first acoustic impedance is lower than the second acoustic impedance.

In accordance with a second aspect of the invention, this object is achieved by a filter having a resonator device according to the invention.

The present invention is based on the finding of using a detuning layer sequence for detuning a piezoelectric resonator device, the detuning layer sequence consisting of at least two layers having different mechanical or acoustic properties and shifting the resonance frequency of the piezoelectric resonator device relative to the resonance frequency of a piezoelectric resonator device not having a detuning layer sequence, which otherwise has the same properties. The first layer has a high acoustic impedance and the second layer has a low acoustic impedance. According to the present invention, the trimming range is enlarged compared to the approaches known from the prior art without causing a variation of the detuning outside a tolerance range.

According to a preferred embodiment of the present invention, the layer having the low acoustic impedance is aluminum (Al), silicon dioxide ($SiO_2$) or another material having a low acoustic impedance. The layer having the high acoustic impedance can be wolfram (W), molybdenum (Mo), platinum (Pt), tantalum oxide ($Ta_2O_5$) or another material having a high acoustic impedance. The order of the layers is in the layer sequence is arbitrary. The thickness of the layer having a high acoustic impedance is preferably in a range of 10 nm to 60 nm, preferably 20 nm to 60 nm, the thickness of the layer having a low acoustic impedance is in a range of 50 nm to 200 nm, preferably 100 nm to 200 nm. The first piezoelectric resonator is preferably a piezoelectric resonator having a piezoelectric layer having a first electrode on a first surface and a second electrode on a second surface.

According to another preferred embodiment, another piezoelectric resonator is provided and the detuning layer sequence is only arranged in the area of the first piezoelectric resonator. The resonance frequencies of the piezoelectric resonator and of the further piezoelectric resonator preferably differ by 2% to 3%. Both piezoelectric resonators can be formed by electrodes arranged on opposing surfaces of a piezoelectric layer. The further piezoelectric resonator is connected between a first node and a second node and the detuned piezoelectric resonator is connected between the second node and ground to provide a filter.

The resonance frequencies of the piezoelectric resonators can be adjusted by changing the thickness of an electrode of the resonators. The thickness of the electrode can be changed by depositing an additional layer on the electrode (for example by sputtering) or by thinning the electrode (for example by etching).

The acoustic impedances of the layers of the detuning layer sequence preferably differ from each other approximately by the factor 2, that is the impedance of the layer having a high acoustic impedance in about double the impedance of the layer having a low acoustic impedance. The impedance of the layer having a high acoustic impedance is preferably larger than about $$60 \times 10^6 \frac{kg}{s \cdot m^2}$$

and in an embodiment is between about $$60 \times 10^6 \frac{kg}{s \cdot m^2}$$

and about $$100 \times 10^6 \frac{kg}{s \cdot m^2}.$$

The impedance of the layer having a low acoustic impedance is preferably smaller than about $$30 \times 10^6 \frac{kg}{s \cdot m^2}$$

and according to an embodiment is between about $$10 \times 10^6 \frac{kg}{s \cdot m^2}$$

and about $$30 \times 10^6 \frac{kg}{s \cdot m^2}.$$

BRIEF DESCRIPTION OF THE DRAWINGS

Preferred embodiments of the present invention will be detailed subsequently referring to the appended drawings, in which.

DESCRIPTION OF THE PREFERRED EMBODIMENTS

Figure 3:
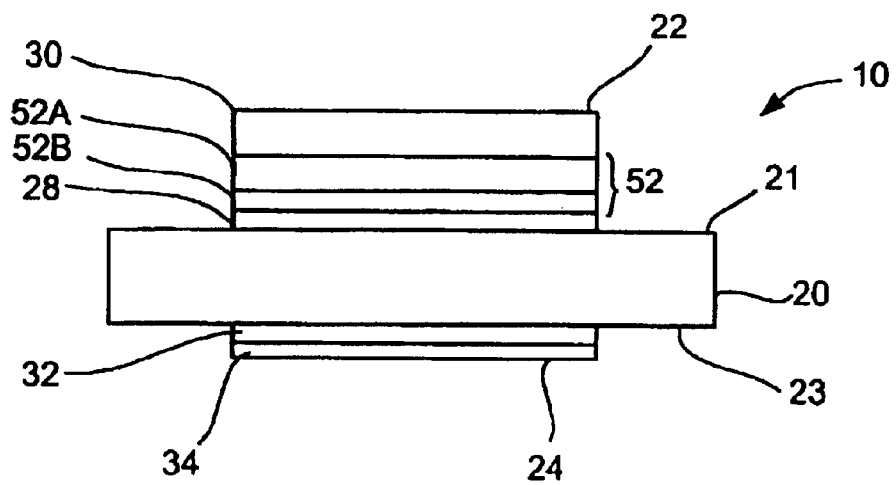
FIG. 3 is a schematic illustration of an inventive piezoelectric resonator device.

FIG. 3 shows a schematic sectional illustration of a preferred embodiment of a piezoelectric resonator device according to the present invention. Elements having already been described with reference to previous Figures have the same reference numerals and are not discussed again. FIG. 3 is a schematic illustration which is not to scale. The proportions of the layer thicknesses of the piezoelectric layer 20 and of the electrodes 22, 24 relative to one another and to the lateral extension of the layers can differ from the proportions illustrated. The lateral extension of the actual piezoelectric resonator 10 is only defined by the lateral extension of the superimposition region of the first electrode 22 and the second electrode 24. The first electrode 22 includes two layers 28 and 30 and the second electrode 24 includes two layers 32 and 34.

Figure 2A:
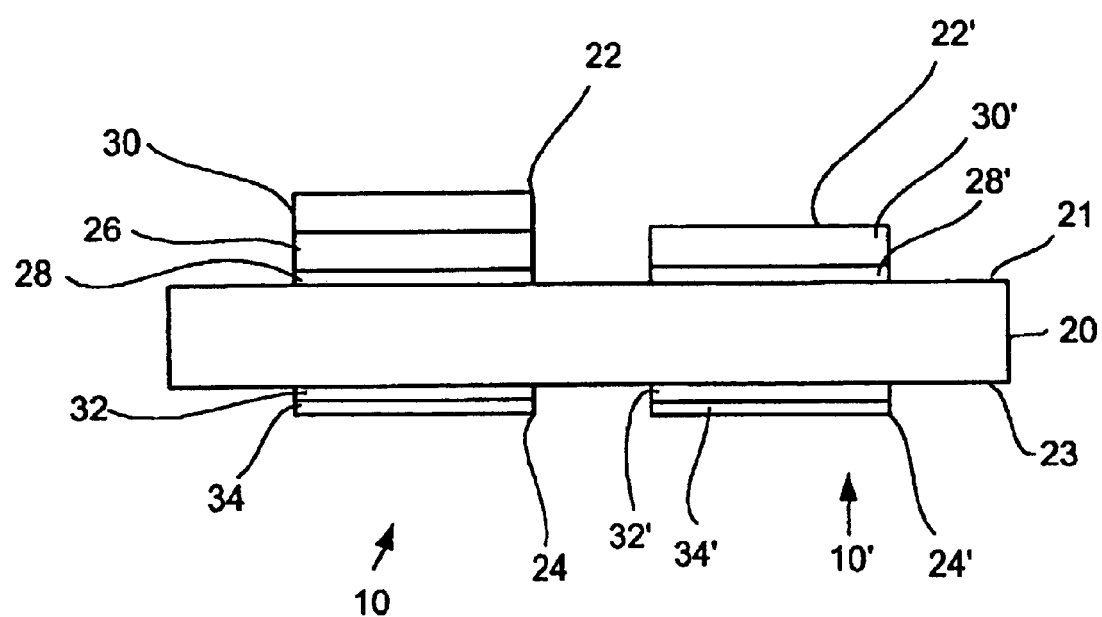
FIG. 2A is a schematic illustration of a piezoelectric resonator device according to the prior art consisting of a detuned resonator having a detuning layer and a non-detuned resonator.

The piezoelectric resonator device in FIG. 3 differs from the detuned resonator 10 shown in FIG. 2A by the fact that instead of the individual detuning layer, a detuning layer sequence 52 arranged between the first layer 28 and the second layer 30 of the first electrode 22 is provided. The detuning layer sequence 52 has a first layer 52A and a second layer 52B. The first layer 52A of the detuning layer sequence 52 preferably has a material having a low acoustic impedance, such as, for example, Al, $SiO_2$. The second layer 52B of the detuning layer sequence 52 preferably has a material having a high acoustic impedance, such as, for example, W, Mo, Pt, $Ta_2O_5$. The order of the layers 52A, 52B in the detuning layer sequence 52 is arbitrary. Preferably, layers of the electrodes and layers of the detuning layer sequence 52 which basically have the same acoustic properties are abutting.

The detuning layer sequence 52 influences the resonance frequency of the piezoelectric resonator 10. It serves for detuning the piezoelectric resonator 10, that is for shifting its resonance frequency, with regard to a piezoelectric resonator not having a detuning layer sequence 52 and otherwise having the same properties.

The manufacturing of the detuning layer sequence 52 only requires an additional depositing step, wherein patterning can take place in a single lithography and etch step.

Compared to detuned piezoelectric resonator devices according to the prior art, the piezoelectric resonator device according to the present invention has advantages when trimming, that is when fine-adjusting the resonance frequency. The trimming of the piezoelectric resonator 10 takes place by changing the thickness of the second layer 30 of the first electrode 22. The change in thickness of the first electrode 22 for example takes place by sputtering an additional layer of the same material or by removing a partial layer (thinning) of the first electrode 22 by etching.

Figure 4A:
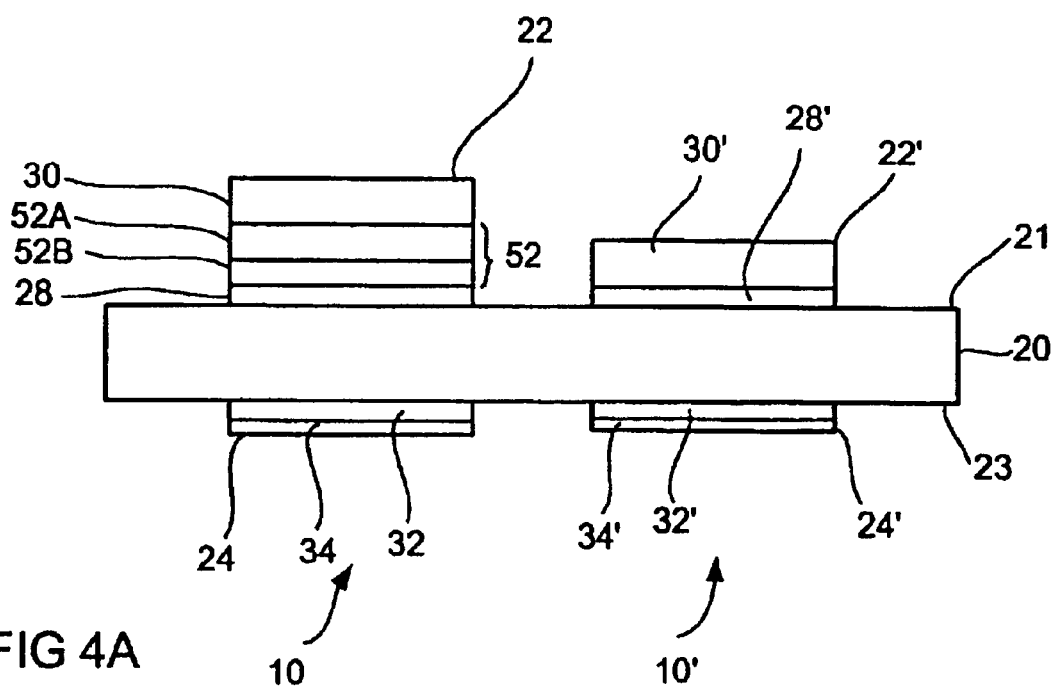
FIG. 4A is a schematic illustration of a piezoelectric resonator device consisting of a detuned resonator according to the present invention and a non-detuned resonator.

FIG. 4A shows an arrangement similar to the one in FIG. 2A, wherein the detuned resonator here comprises the detuning layer sequence according to the present invention. In FIG. 4A, a preferred embodiment is shown in which the resonators 10, 10' are connected in such a way that a filter is formed. The non-detuned resonator 10' is connected in series between an input and an output and the detuned resonator 10 is the shunt resonator. The piezoelectric layer 20 is made of AlN and has a thickness between 2 $\mu$m and 3 $\mu$m, preferably 2.4 $\mu$m. The first layers 32, 32' of the second electrodes 24, 24' are made of wolfram and have a thickness of 150 nm to 500 nm, preferably 300 nm to 500 nm and according to a present embodiment 400 nm. The second layers 34, 34' of the second electrodes 24, 24' are made of aluminum and have a thickness of 150 nm to 500 nm, preferably 300 nm to 500 nm and according to a preferred embodiment 400 nm. The first layers 28, 28' of the first electrodes 22, 22' are made of wolfram and have a thickness of 50 nm to 300 nm, preferably 100 nm to 300 nm and according to a preferred embodiment 220 nm. The second layers 30, 30' of the first electrodes 22, 22' are made of aluminum and have a thickness of 250 nm to 700 nm, preferably 500 nm to 700 nm and according to a preferred embodiment 660 nm. The first detuning layer 52A is made of aluminum and has a thickness of 50 nm to 100 nm, preferably 100 nm to 200 nm and according to a preferred embodiment 130 nm. The second detuning layer 52B is made of molybdenum and has a thickness of 10 nm to 60 nm, preferably 20 nm to 60 nm and according to a preferred embodiment 40 nm. A fine-adjustment of the frequency of the resonators 10 and 10' or a frequency correction required, respectively, takes place by changing the thickness of the first electrodes 22, 22' within certain limits. For this, material from the first electrode 22, 22' is eroded by a suitable method so that its lateral thickness is reduced uniformly or additional material is deposited on the first electrode 22, 22' so that the thickness of it is increased laterally in a homogenous way. The eroding is, for example, possible by an etching process, wherein depositing is, for example, possible by sputtering.

Figure 2B:
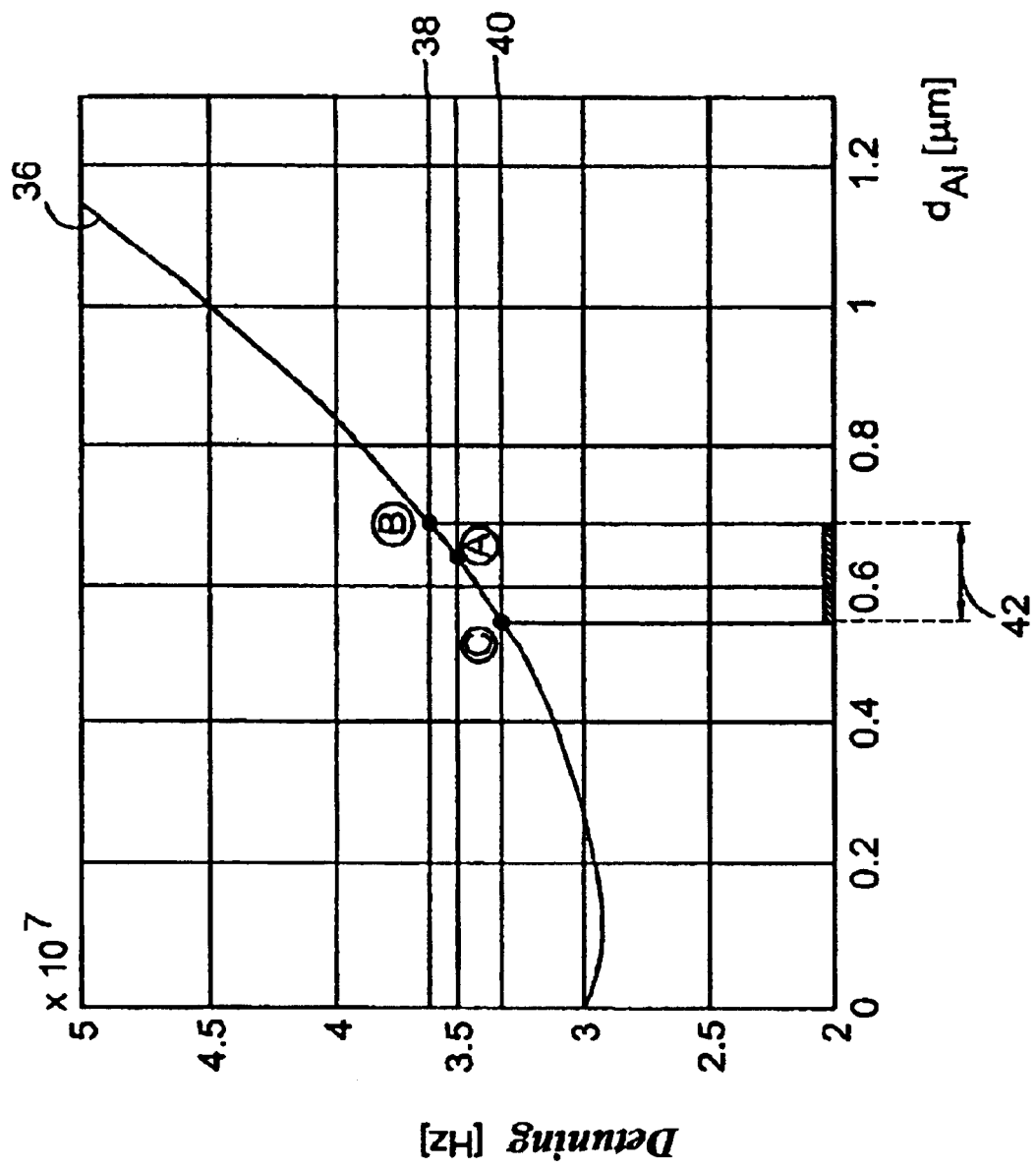
FIG. 2B is a schematic diagram showing the influence of a detuning layer having a low acoustic impedance on detuning when trimming the resonance frequency of a well-known resonator.
Figure 2C:
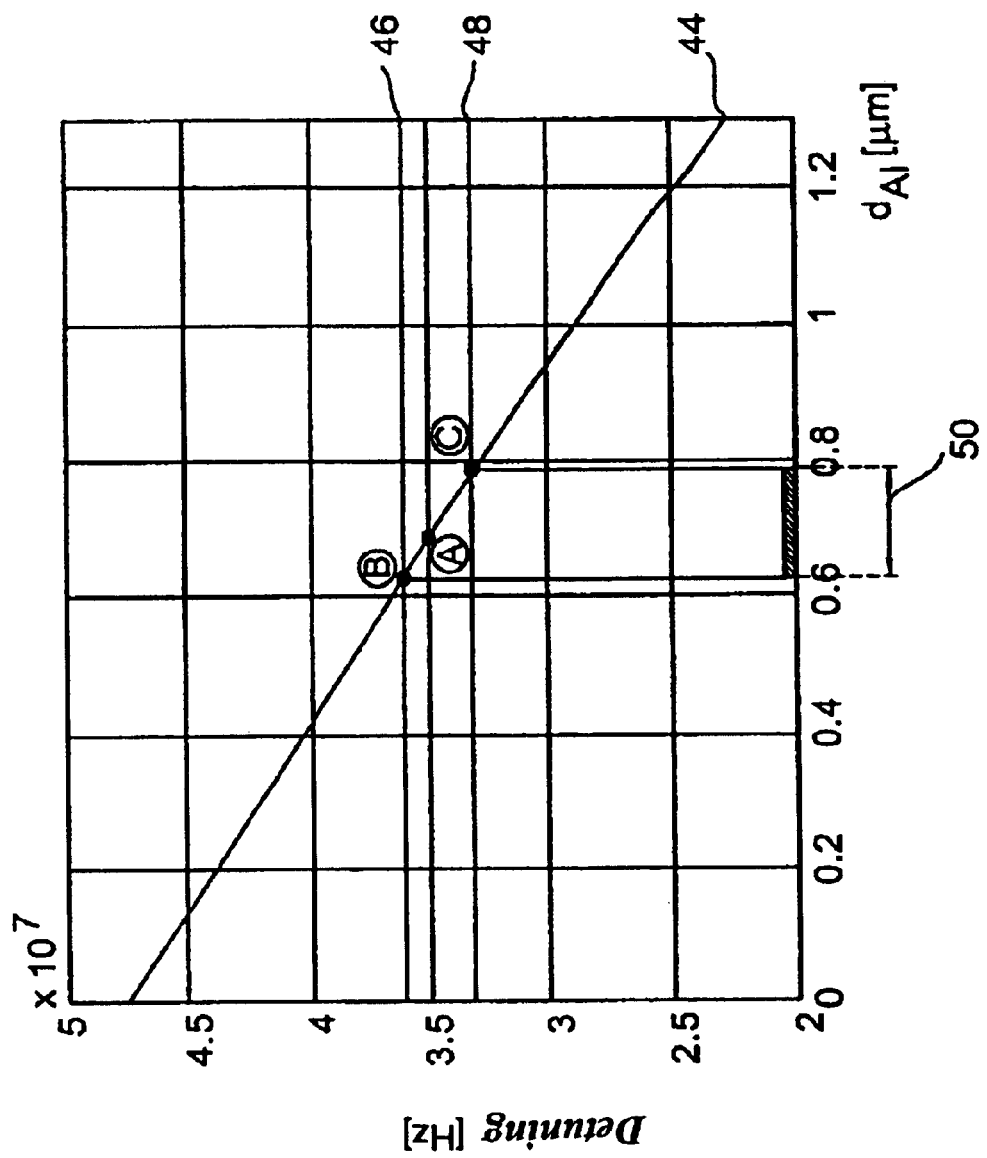
FIG. 2C is a schematic diagram showing the influence of a detuning layer having a high acoustic impedance on detuning when trimming the resonance frequency of a well-known resonator.
Figure 4B:
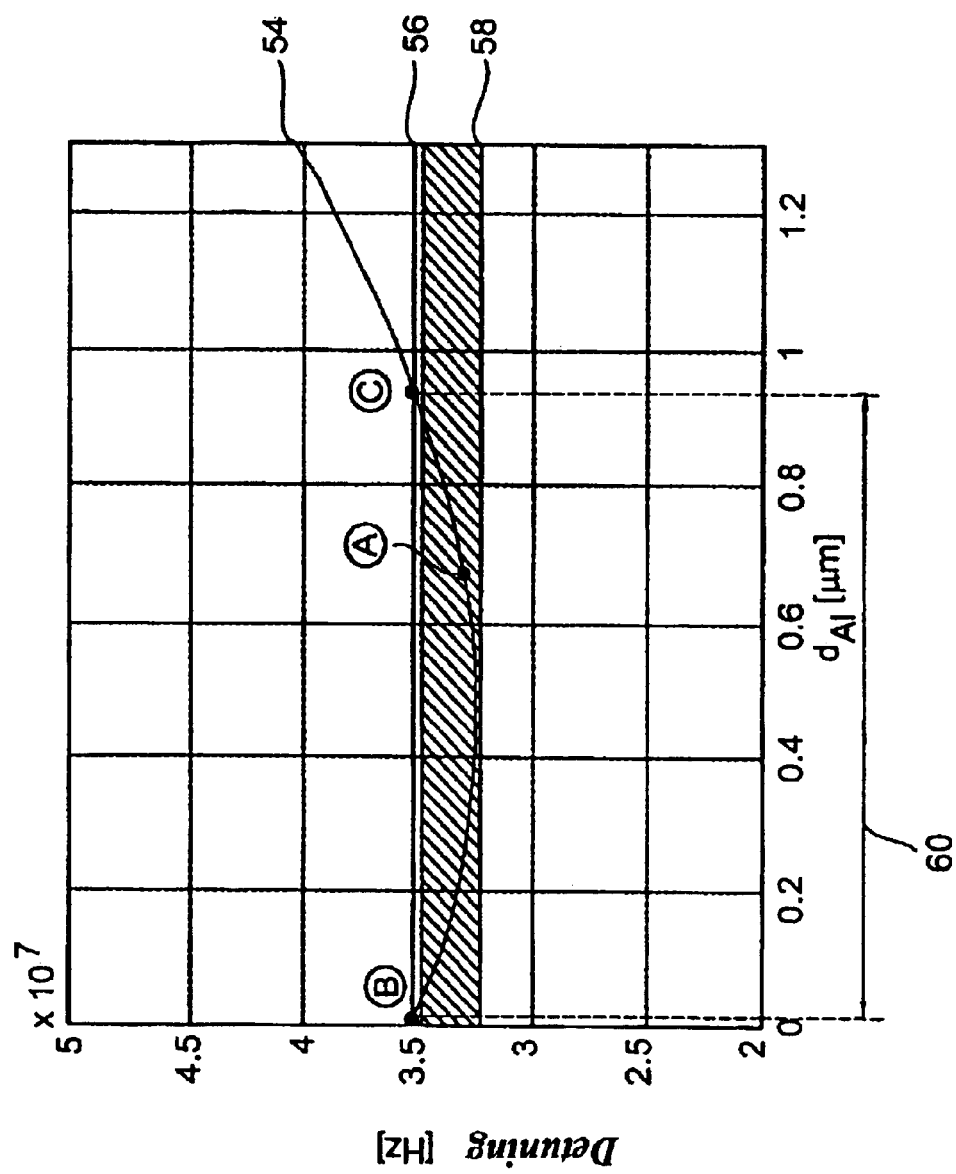
FIG. 4B is a schematic diagram showing the influence of the inventive detuning layer sequence on detuning when trimming the resonance frequency of the resonator.

FIG. 4B, for the arrangement of FIG. 4A, in analogy to FIGS. 2B and 2C, schematically shows the dependence of detuning the piezoelectric resonator device according to the present invention relative to a resonator not having a detuning layer sequence but otherwise having the same properties, on the thickness $d_{Al}$ of the aluminum layer 30 of the first electrode 22. FIG. 4B schematically shows the detuning versus the thickness $d_{Al}$ of the aluminum layer of the first electrode, wherein the curve 54 gives the magnitude of detuning as a function of the thickness $d_{Al}$ with a constant thickness of the detuning layer sequence 52. Since the detuning layer sequence 52 of the inventive piezoelectric resonator device includes the first layer 52A having a low impedance and the second layer 52B having a high impedance, the resulting dependence of detuning on the thickness $d_{Al}$ of the first electrode 22 approximately is a superimposition of the dependencies illustrated in FIGS. 2B and 2C, respectively. A comparably weak dependence of the detuning of the piezoelectric resonator on the thickness $d_{Al}$ of the first electrode, that is a considerably flatter course of the curve, results. With a thickness of the aluminum layer of about 0.66 $\mu$m, detuning is about 35 MHz, as is illustrated by point A. The influence of an increase or decrease of the thickness $d_{Al}$ of the first electrode on detuning is considerably smaller. A tolerance range still acceptable is illustrated by the lines 56 and 58, within which a variation from the must detuning effected by an additional frequency correction (trimming) is allowed to be. Within this tolerance range, the effects of the variation of detuning from the 35 MHz due to the frequency correction on the properties of a filter including the resonator detuned in this way are still negligible or at least acceptable.

A thickness range 60 is set by the intersections B and C of curve 54 with the lines 56 and 58, respectively, within which the thickness $d_{Al}$ of the aluminum layer of the first electrode may be changed. Due to the low gradient of the curve 54, a large range of thicknesses of a little more than 0 µm to about 0.95 µm is set, unlike in the prior art. The thickness of the aluminum layer of the first electrode can be changed in this range without causing a change of detuning outside the tolerance range.

If the tolerance range shown in FIG. 4B is fully exploited, that is if progress is made along the curve 54 from point B via point A to point C, a frequency correction of −30 MHz to +60 MHz with a resonance frequency of 900 MHz of the resonator is obtainable by changing the thickness $d_{Al}$. Put differently, a shift of the resonance frequency of the resonator 22 by −30 MHz to +60 MHz results in a change of detuning still within the tolerance range.

It is an essential feature of the present invention that the detuning layer sequence 52 includes several layers 52A, 52B comprising different acoustic impedances. The number, the order and the thicknesses of the individual layers 52A, 52B of the detuning layer sequence 52 as well as the location where the detuning layer sequence is arranged can, however, differ from the illustrations in FIGS. 3 and 4A. Unlike is illustrated in FIGS. 3 and 4A, the detuning layer sequence can also be arranged between the first and the second layer of the second electrode. Alternatively, the detuning layer sequence can also be arranged between the piezoelectric layer and the first electrode or the second electrode or on the first or the second electrode. In addition, the detuning layer sequence 52 can comprise more than two individual layers 52A, 52B. The set-up of the detuning layer sequence 52, that is number, materials, thicknesses and sequence of the individual layers, is preferably selected such that, similarly to the illustration of FIG. 4B, a small dependence of the detuning on the thickness of the first electrode 22 results.

The thickness of the different layers additionally depends on the frequency correction used, either depositing additional material on the electrode or thinning the electrode. Optimal solutions can, for example, be found by simulation using the well-known Mason model approach described by K. M. Lakin and others in IEEE Trans. Microwave Theory Techniques, Volume 41, No. 12, 1993.

Instead of the multi-layered electrodes described above having two or more layers, electrodes having only one layer can also be used.

According to the general tendency in all the areas of microelectronics to embody as many, even different, circuit elements as possible integrally or to integrate them into an element, several piezoelectric resonators are manufactured on a substrate with the same process steps for many applications. These several resonators, among one another, can comprise the same or different resonance frequencies. The piezoelectric resonator device depicted in FIG. 4A is an example of this.

Figure 5:
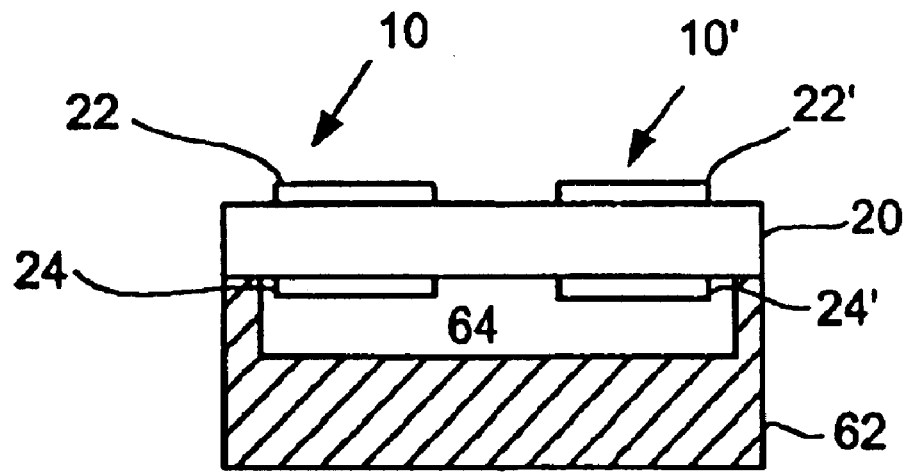
FIG. 5 is a schematic illustration of the arrangement of FIG. 4A on a substrate having a cavity as an acoustic isolator.
Figure 6:
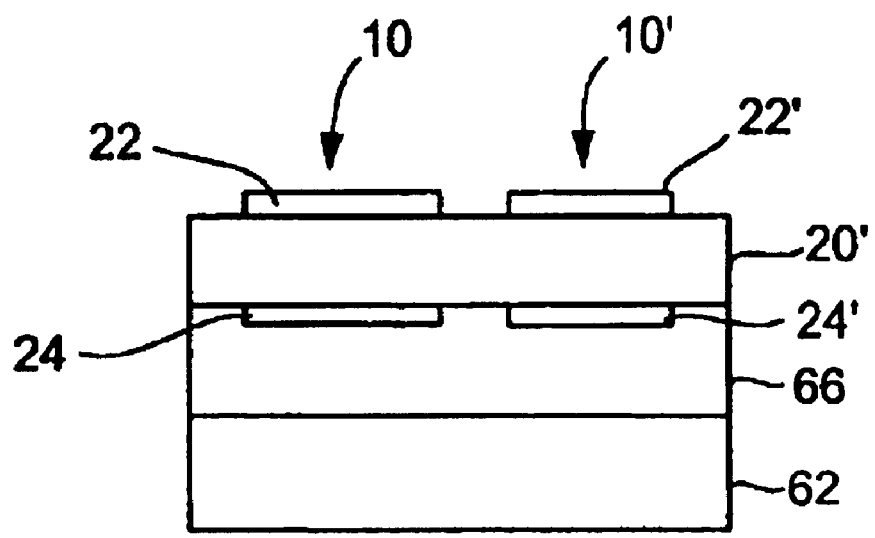
FIG. 6 is a schematic illustration of the arrangement of FIG. 4A on a substrate having an acoustic reflector as an acoustic isolator.

The inventive resonator device can be held in different ways. According to an embodiment, the resonator device can be carried in a casing such that the areas below and above the electrodes are free. Conventionally, the resonator device is carried on a substrate. In order not to influence an oscillation of the resonator, it is necessary to isolate it acoustically from the substrate. Referring to FIGS. 5 and 6, two possibilities for acoustically isolating an arrangement according to FIG. 4A are illustrated, wherein the arrangement is only shown schematically.

In FIG. 5, the arrangement of FIG. 4a is arranged on a substrate 62. The substrate 62 includes a cavity 64 for acoustic isolation.

In FIG. 6, the arrangement of FIG. 4a is arranged on a substrate 62. An acoustic reflector 66 formed by several layers is arranged between the arrangement and the substrate 62 for acoustic isolation.

Figure 7A:
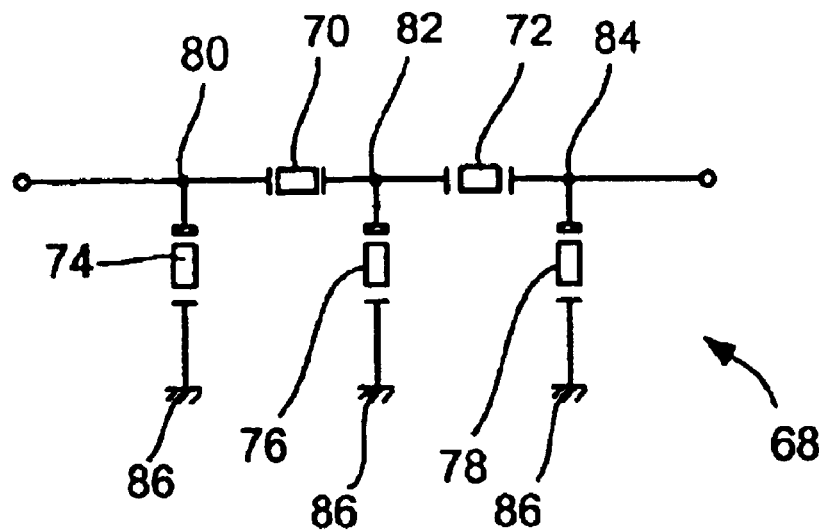
FIG. 7A shows a first circuit diagram of an inventive frequency filter.

FIG. 7A schematically shows an asymmetrical filter circuit 68 of the ladder type having five piezoelectric resonators 70, 72, 74, 76, 78. The first resonator 70 is connected between a first node 80 and a second node 82 and the second resonator 72 is connected between the second node 82 and a third node 84. The third resonator 74 is connected between the first node 80 and a reference potential 86, such as, for example, ground, the fourth resonator 76 is connected between the second node 82 and the reference potential 86 and the fifth resonator 78 is connected between the third node 84 and the reference potential 86. In this asymmetrical circuit used as a frequency filter, the third, fourth and fifth resonators 74, 76, 78, which are also referred to as shunt resonators, are detuned compared to the two resonators 70, 72 connected in series by about 2% to 3% in the direction of a lower resonance frequency, which preferably corresponds to 50% to 80% of the filter bandwidth. The filter circuit is realized by a piezoelectric resonator device corresponding to the piezoelectric resonator device of FIG. 4A, which, however, comprises two non-detuned piezoelectric resonators as a first and a second resonator 70, 72 and in addition three detuned piezoelectric resonators as a third, a fourth and a fifth resonator 74, 76, 78. The first electrodes and the second electrodes of the resonators are connected to one another by suitable conductive traces such that the filter circuit results.

Figure 7B:
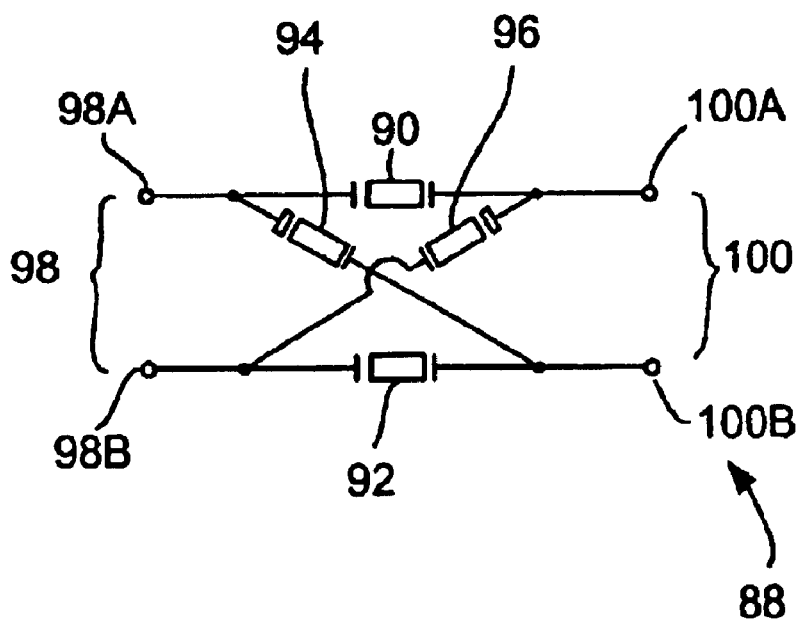
FIG. 7B shows a second circuit diagram of an inventive frequency filter.

FIG. 7B schematically shows a symmetrical filter circuit 88 having four piezoelectric resonators 90, 92, 94, 96. This circuit includes an input 98 having input terminals 98A and 98B and an output 100 having output terminal 100A, 100B. The first resonator 90 is connected between the input terminal 98A and the output terminal 100A, the second resonator 92 is connected between the input terminal 98B and the output terminal 100B, the third resonator 94 is connected between the input terminal 98A and the output terminal 100B and the fourth resonator 96 is connected between the input terminal 98B and the output terminal 100A. The resonators 94 and 96, compared to the resonators 90 and 92, are detuned by about 2% to 3% in the direction of a lower resonance frequency, which preferably corresponds to about 50% to 80% of the filter bandwidth. The filter circuit is realized by a piezoelectric resonator device corresponding to the piezoelectric resonator device of FIG. 4A, which, however, has two non-detuned piezoelectric resonators as a first and a second resonator 90, 92 and in addition two detuned piezoelectric resonators as a third and a fourth resonator 94, 96. The first electrodes and the second electrodes of the resonators are connected to one another by suitable conductive traces such that the filter circuit results.

Figure 1A:
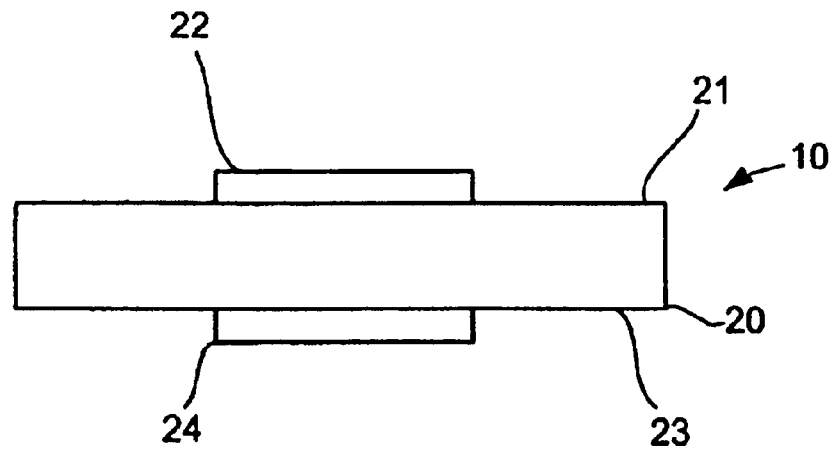
FIG. 1A is a schematic illustration of a piezoelectric resonator device according to the prior art.
Figure 1B:
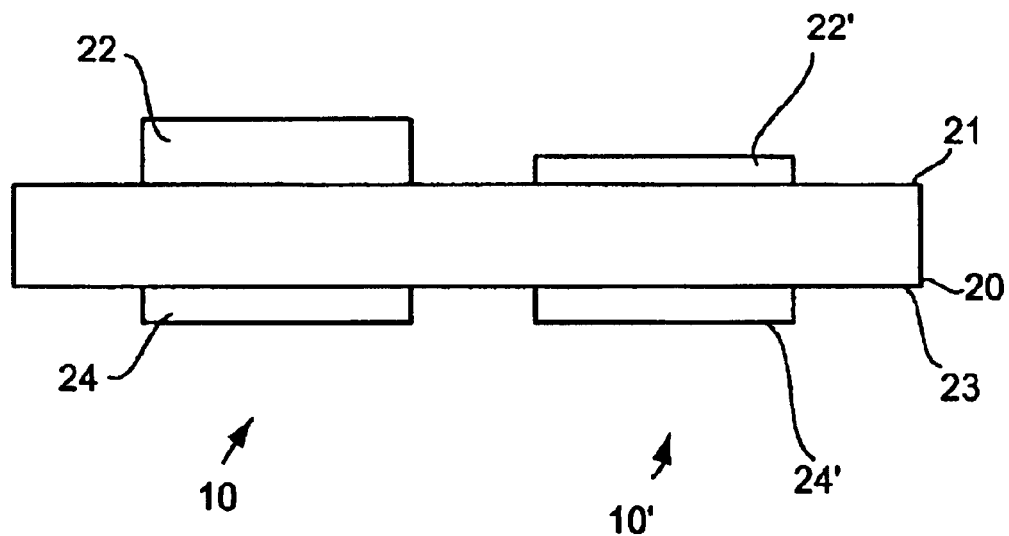
FIG. 1B is a schematic illustration of a piezoelectric resonator device according to the prior art consisting of a detuned and a non-detuned resonator.

Alternatively, the filters shown in FIGS. 7A and 7B can be formed by conventional resonator devices which have been described referring to FIG. 1 and resonator devices having been described referring to FIG. 3.

Instead of the method described above for changing the resonance frequency of the resonator by changing the thickness of the upper electrode, other methods well known in the prior art for changing the resonance frequency can be used.

As has been described above, the detuning layer sequence according to the present invention can be arranged either on the above electrode which is trimmed in the course of the frequency adjustment. Alternatively, the detuning layer sequence can be arranged on the lower electrode which is not influenced by a frequency adjustment (trimming).

The piezoelectric resonator, in the embodiments described, is formed by a piezoelectric layer. Instead of this design, the piezoelectric resonator can also include a plurality of piezoelectric layers.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

We claim:

1. A resonator device comprising:
    a first piezoelectric resonator and a second piezoelectric resonator, wherein the first piezoelectric resonator and the second piezoelectric resonator each have a piezoelectric layer having a first surface and a second surface, a first electrode on the first surface and a second electrode on the second surface; and
    a detuning layer sequence arranged on the first piezoelectric resonator wherein
    the detuning layer sequence is arranged on the first electrode of the first piezoelectric resonator or on the second electrode of the first piezoelectric resonator; and
    the detuning layer sequence comprises at least a first layer having a first acoustic impedance and a second layer having a second acoustic impedance in order to shift a resonance frequency of the first piezoelectric resonator relative to the resonance frequency of the second piezoelectric resonator, wherein the first acoustic impedance is lower than the second acoustic impedance.

2. The resonator device according to claim 1, wherein the acoustic impedances of the layers of the detuning layer sequence differ from each other by the factor 2.

3. The resonator device according to claim 1, wherein the impedance of the layer having a high acoustic impedance is between $$60 \times 10^6 \frac{\text{kg}}{\text{s} \cdot \text{m}^2}$$

and $$100 \times 10^6 \frac{\text{kg}}{\text{s} \cdot \text{m}^2},$$

and wherein the impedance of a layer having a low acoustic impedance is between $$10 \times 10^6 \frac{\text{kg}}{\text{s} \cdot \text{m}^2}$$

and $$30 \times 10^6 \frac{\text{kg}}{\text{s} \cdot \text{m}^2}.$$

4. The resonator device according to claim 1, wherein the layer having a low acoustic impedance comprises Al or $SiO_2$.

5. The resonator device according to claim 1, wherein the layer having a high acoustic impedance comprises W, Mo, Pt or $Ta_2O_5$.

6. The resonator device according to claim 1, wherein the first layer having a low acoustic impedance has a thickness in the range of 50 nm to 200 nm, and wherein the second layer having a high acoustic impedance has a thickness in the range of 10 nm to 60 nm.

7. The resonator device according to claim 1, having a substrate, on which the first and the second piezoelectric resonator are arranged in an acoustically isolated way.

8. The resonator device according to claim 7, wherein a cavity or an acoustic reflector is arranged between the first piezoelectric resonator and the substrate and between the second piezoelectric resonator and the substrate for acoustic isolation.

9. The resonator device according to claim 1, wherein the resonance frequencies of the piezoelectric resonator and of the second piezoelectric resonator differ by 2% to 3%.

10. The resonator device according to claim 1, wherein the second piezoelectric resonator is connected between a first node and a second node, and wherein the first piezoelectric resonator is connected between the second node and a reference potential.

11. The resonator device according to claim 1, wherein the first and the second piezoelectric resonator include a plurality of piezoelectric layers.

12. A filter comprising a resonator device, the resonator device comprising:
    a first piezoelectric resonator and a second piezoelectric resonator, wherein the first piezoelectric resonator and the second piezoelectric resonator each have a piezoelectric layer having a first surface and a second surface, a first electrode on the first surface and a second electrode on the second surface; and
    a detuning layer sequence arranged on the first piezoelectric resonator wherein
    the detuning layer sequence is arranged on the first electrode of the first piezoelectric resonator or on the second electrode of the first piezoelectric resonator; and
    the detuning layer sequence comprises at least a first layer having a first acoustic impedance and a second layer having a second acoustic impedance in order to shift a resonance frequency of the first piezoelectric resonator relative to the resonance frequency of the second piezoelectric resonator, wherein the first acoustic impedance is lower than the second acoustic impedance.

13. A resonator device comprising:
    a piezoelectric layer having a first and a second surface,
    a first electrode arranged on the first surface and a second electrode arranged on the second surface opposite of the first electrode;
    a third electrode arranged on the first surface and a fourth electrode arranged on the second surface opposite of the third electrode; and
    a detuning layer sequence arranged on the first electrode or on the second electrode; and
    the detuning layer sequence comprises at least a first layer having a first acoustic impedance and a second layer having a second acoustic impedance, wherein the first acoustic impedance is lower than the second acoustic impedance.

14. The resonator device according to claim 13, wherein the acoustic impedances of the layers of the detuning layer sequence differ from each other by the factor 2.

15. The resonator device according to claim 13, wherein the impedance of the layer having a high acoustic impedance is between $$60 \times 10^6 \ \frac{\text{kg}}{\text{s} \cdot \text{m}^2}$$

and $$100 \times 10^6 \ \frac{\text{kg}}{\text{s} \cdot \text{m}^2},$$

and wherein the impedance of a layer having a low acoustic impedance is between $$10 \times 10^6 \ \frac{\text{kg}}{\text{s} \cdot \text{m}^2}$$

and $$30 \times 10^6 \ \frac{\text{kg}}{\text{s} \cdot \text{m}^2}.$$

16. The resonator device according to claim 13, wherein the layer having a low acoustic impedance comprises Al or $SiO_2$.

17. The resonator device according to claim 13, wherein the layer having a high acoustic impedance comprises W, Mo, Pt or $Ta_2O_5$.

18. The resonator device according to claim 13, wherein the first layer having a low acoustic impedance has a thickness in the range of 50 nm to 200 nm, and wherein the second layer having a high acoustic impedance has a thickness in the range of 10 nm to 60 nm.

19. The resonator device according to claim 13, having a substrate, on which the piezoelectric layer is arranged in an acoustically isolated way.

20. The resonator device according to claim 19, wherein a cavity or an acoustic reflector is arranged between the piezoelectric layer and the substrate for acoustic isolation.

21. The resonator device according to claim 13, wherein the resonance frequencies of the resonator device differ by 2% to 3%.

22. The resonator device according to claim 13, wherein the third and fourth electrodes are connected between a first node and a second node, and wherein the first and second electrodes are connected between the second node and a reference potential.

23. The resonator device according to claim 13, wherein the piezoelectric layer includes a plurality of piezoelectric layers.

* * * * *